(12) United States Patent
Mauritzson et al.

(10) Patent No.: US 7,829,832 B2
(45) Date of Patent: Nov. 9, 2010

(54) METHOD FOR OPERATING A PIXEL CELL USING MULTIPLE PULSES TO A TRANSISTOR TRANSFER GATE

(75) Inventors: Richard A. Mauritzson, Meridian, ID (US); Gennadiy A. Agranov, Boise, ID (US); Sungkwon C. Hong, Boise, ID (US); Canaan S. Hong, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 1405 days.

(21) Appl. No.: 11/213,815

(22) Filed: Aug. 30, 2005

(65) Prior Publication Data

US 2007/0045681 A1    Mar. 1, 2007

(51) Int. Cl.
*H01L 27/00*    (2006.01)
*H04N 3/14*    (2006.01)

(52) U.S. Cl. .................... 250/208.1; 348/308
(58) Field of Classification Search ............. 250/208.1; 348/308
See application file for complete search history.

(56) References Cited

U.S. PATENT DOCUMENTS 5,283,426 A    2/1994    Bowlby, Jr. et al.
6,002,123 A *  12/1999   Suzuki ................ 250/208.1
2004/0242211 A1  12/2004  Akhteruzzaman et al.
2005/0012168 A1   1/2005  Hong
2005/0167602 A1*  8/2005  Dierickx ............ 250/370.01
2006/0249731 A1* 11/2006  Ladd .................... 257/59

FOREIGN PATENT DOCUMENTS

EP    0 863 663 A2    9/1998
EP    1 119 188 A2    7/2001

OTHER PUBLICATIONS

Written Opinion of the International Searching Authority, Mar. 13, 2008. (PCT/US2006/033505).
Taiwan (ROC) Office Action, Sep. 23, 2009.

* cited by examiner

*Primary Examiner*—Thanh X Luu

(57) ABSTRACT

Methods for operating a pixel cell include efficient transferring of photo-charges using multiple pulses to a transistor transfer gate during a charge integration period for an associated photosensor. The pixel cell can be operated with efficient transfer characteristics in either normal or high dynamic range (HDR) mode. The high dynamic range can be realized by either operating an optional HDR transistor or by fluctuating the voltage applied to a reset gate.

7 Claims, 10 Drawing Sheets

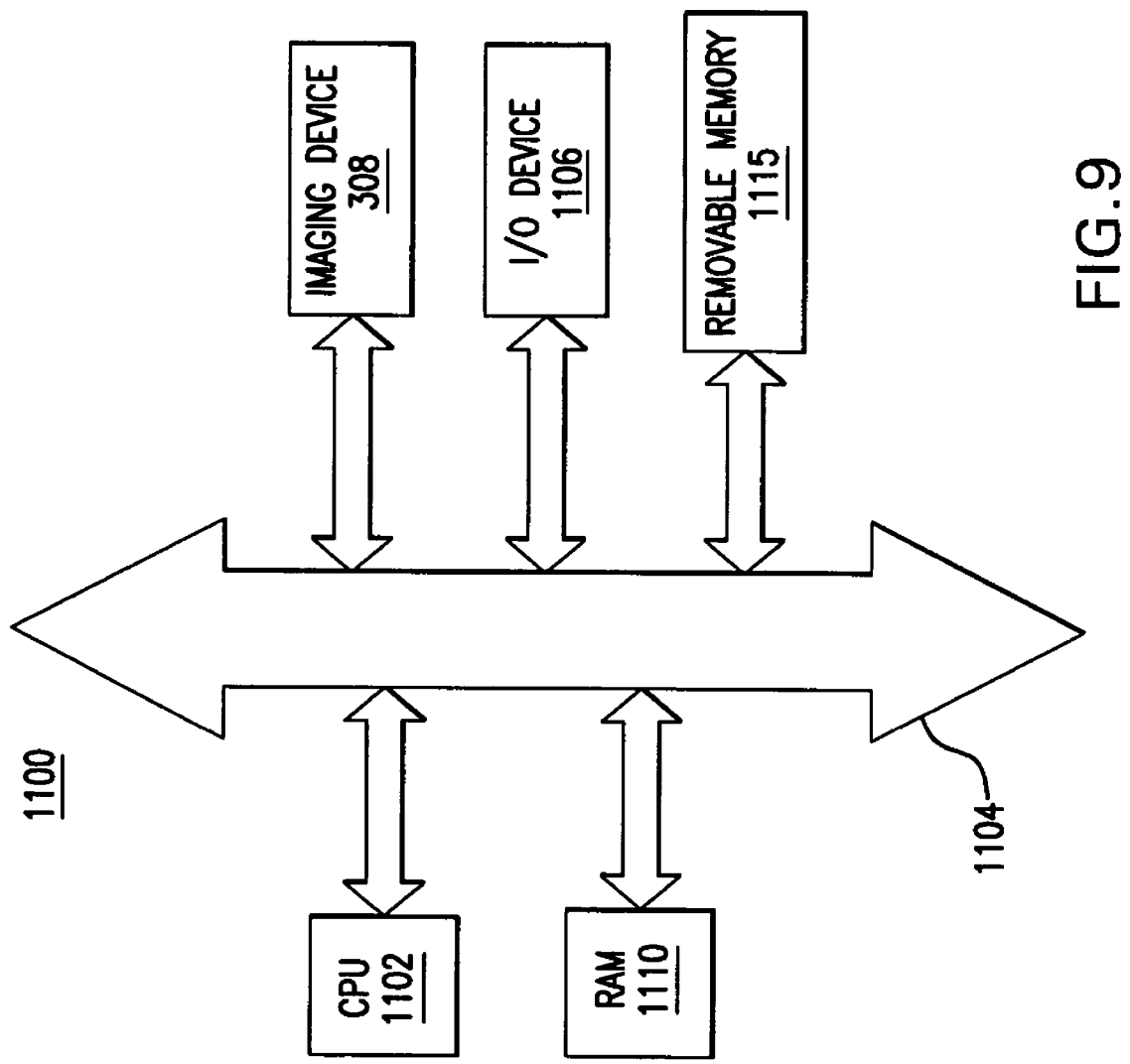

METHOD FOR OPERATING A PIXEL CELL USING MULTIPLE PULSES TO A TRANSISTOR TRANSFER GATE

FIELD OF THE INVENTION

The present invention relates generally to semiconductor devices, and more particularly, to transfer transistor technology, for use in imager pixels.

BACKGROUND OF THE INVENTION

CMOS image sensors are increasingly being used as low cost imaging devices. A CMOS image sensor circuit includes a focal plane array of pixel cells, each one of the cells includes a photosensor, such as e.g., a photogate, photoconductor, or photosensor having an associated charge accumulation region within a substrate for accumulating photo-generated charge. Each pixel cell may include a transistor for transferring charge from the charge accumulation region to a sensing node, and a transistor for resetting the sensing node to a predetermined charge level prior to charge transference. The pixel cell may also include a source follower transistor for receiving and amplifying charge from the sensing node and an access transistor, for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, which describe the operation of conventional CMOS image sensors and are assigned to Micron Technology, Inc., the contents of which are incorporated herein by reference.

A top-down view of a conventional CMOS pixel cell 10 is shown in FIG. 1. The illustrated CMOS pixel cell 10 is a four transistor (4T) cell. The CMOS pixel cell 10 generally comprises a photosensor, e.g., a photodiode 13, for generating and collecting charge in response to light incident on the pixel cell 10, and a transfer transistor having a gate 7 for transferring photoelectric charges from the photodiode 13 to a sensing node, which is typically a floating diffusion region 3. The floating diffusion region 3 is electrically connected to the gate 27 of an output source follower transistor. The pixel cell 10 also includes a reset transistor having a gate 17 for resetting the floating diffusion region 3 to a predetermined voltage; and a row select transistor having a gate 37 for outputting a signal from the source follower transistor 27 to an output terminal in response to an address signal on gate 37.

FIG. 2 is a cross-sectional view of a portion of the pixel cell 10 of FIG. 1, taken along line 2-2', showing the photosensor 13 constructed as a photodiode, transfer transistor having a gate 7 and reset transistor having a gate 17. The CMOS pixel cell 10 has a photodiode 13 that may be formed as a pinned photodiode. The illustrated photodiode has a p-n-p construction comprising a p-type surface layer 5 and an n-type photodiode charge collection region 14 within a p-type substrate 2. The photodiode 13 is adjacent to and partially underneath the gate 7 of the transfer transistor. The reset transistor gate 17 is on a side of the transfer transistor gate 7 opposite the photodiode 13. As shown in FIG. 2, the reset transistor includes a source/drain region 32, which is adjacent an isolation region 9. The floating diffusion region 3 is located between the gates 7, 17 of the transfer and reset transistor.

One conventional method for operating the CMOS pixel cell 10 depicted in FIGS. 1 and 2 is illustrated as a timing diagram in FIG. 3. An integration period is initiated for the pixel cell 10 at time $T_0$ after resetting the photodiode 13 and floating diffusion region 3 by turning transfer and reset gate control signals TX and RST to high. Integration thus begins when the transfer transistor and reset gates turn off. During the integration period, electrons are generated by light incident on the photodiode 13 and are stored in the n-type charge collection region 14. These charges are transferred to the floating diffusion region 3 by the transfer transistor when the transfer transistor gate 7 is turned on again, at time, $T_1$. The source follower transistor produces an output signal based on the transferred charges, stored in the floating diffusion region 3. After charge transfer, e.g., at time $T_2$, the row select gate 37 is turned on by applying a row select signal RS. This outputs the signal produced by the source follower transistor to an appropriate column line for readout sampling. It should be noted that FIG. 3 only depicts the timing for the transfer and readout of the photodiode 13 signal. There is typically an additional readout of the floating diffusion region 3 by the row select gate 27 after region 3 is reset (for correlated double sampling or CDS).

One common problem associated with conventional imager pixel cells, such as pixel cell 10, is dark current, that is, current generated due to electron generation/recombination collected in the photodiode 13 in the absence of light. Dark current may be caused by many different factors, including: photodiode junction leakage, leakage along field isolation edges, transistor sub-threshold leakage, drain induced barrier lowering leakage, gate induced drain leakage, trap assisted tunneling, and pixel fabrication defects.

The area directly under the edge of the transfer transistor gatestack 7 is a significant source of dark current. The n-type charge collection region 14 of photodiode 13 is formed close to the surface of the substrate 2 under the transfer gatestack 7 in order to improve transfer efficiency. This causes the photodiode depletion region created during the integration period for the pixel cell 10, and being associated with the n-type accumulation region 14 and the p-type surface region 5, to also be close to the surface of the substrate 2 in this area. This area has a large number of thermally-created electron/hole pairs due to interstitial silicon surface vacancies, especially near the transfer transistor gatestack edge. After reset and during integration, the photodiode 13 is reverse biased, and the electric field created sweeps the thermally created holes into the p-type surface region 5 and the thermally created charge carriers over to the n-type charge collection area 14 of the photodiode 13. These thermally generated charge carriers increase the unwanted dark current for image pixel cell 10 in the area under the transfer gatestack 7.

Another problem associated with conventional transfer gate technology involves fixed pattern noise and lag due to poor charge transfer efficiency. Partially turning on the transfer gate 17 to minimize dark current, however, leads to fixed pattern noise and lag, as the potential barrier of the transfer gate may be too high to fully transfer all of the photo-generated charges.

Accordingly, a pixel cell having efficient charge transfer with minimized dark current, fixed pattern noise, and lag is desired. Also needed is a simple method of fabricating and operating such a pixel cell.

BRIEF SUMMARY OF THE INVENTION

The present invention, as described in various exemplary embodiments, provides operation of pixel cell with an efficient transfer transistor having a transfer gate that is activated by pulses either during or at the end of a charge integration period for the pixel cell.

In accordance with a first exemplary method of operating a pixel cell in accordance with the invention, a reset gate is maintained at a constant voltage during charge integration, and the transfer gate is similarly maintained until being pulsed at the end of a charge integration period.

In accordance with a second exemplary method of operating the pixel cell in accordance with the invention, a reset gate voltage fluctuates in a controlled manner, and the transfer gate signal is pulsed several times during the charge integration time. In one embodiment, a pulse is generated each time the reset gate voltage fluctuates. The method can also increase the dynamic range of the pixel cell.

BRIEF DESCRIPTION OF THE DRAWINGS

The foregoing and other aspects of the invention will be better understood from the following detailed description of the invention, which is provided in connection with the accompanying drawings, in which:

FIG. 9 is a diagram of a computer processor system incorporating an exemplary CMOS image sensor of the present invention.

DETAILED DESCRIPTION OF THE INVENTION

Figure 1:
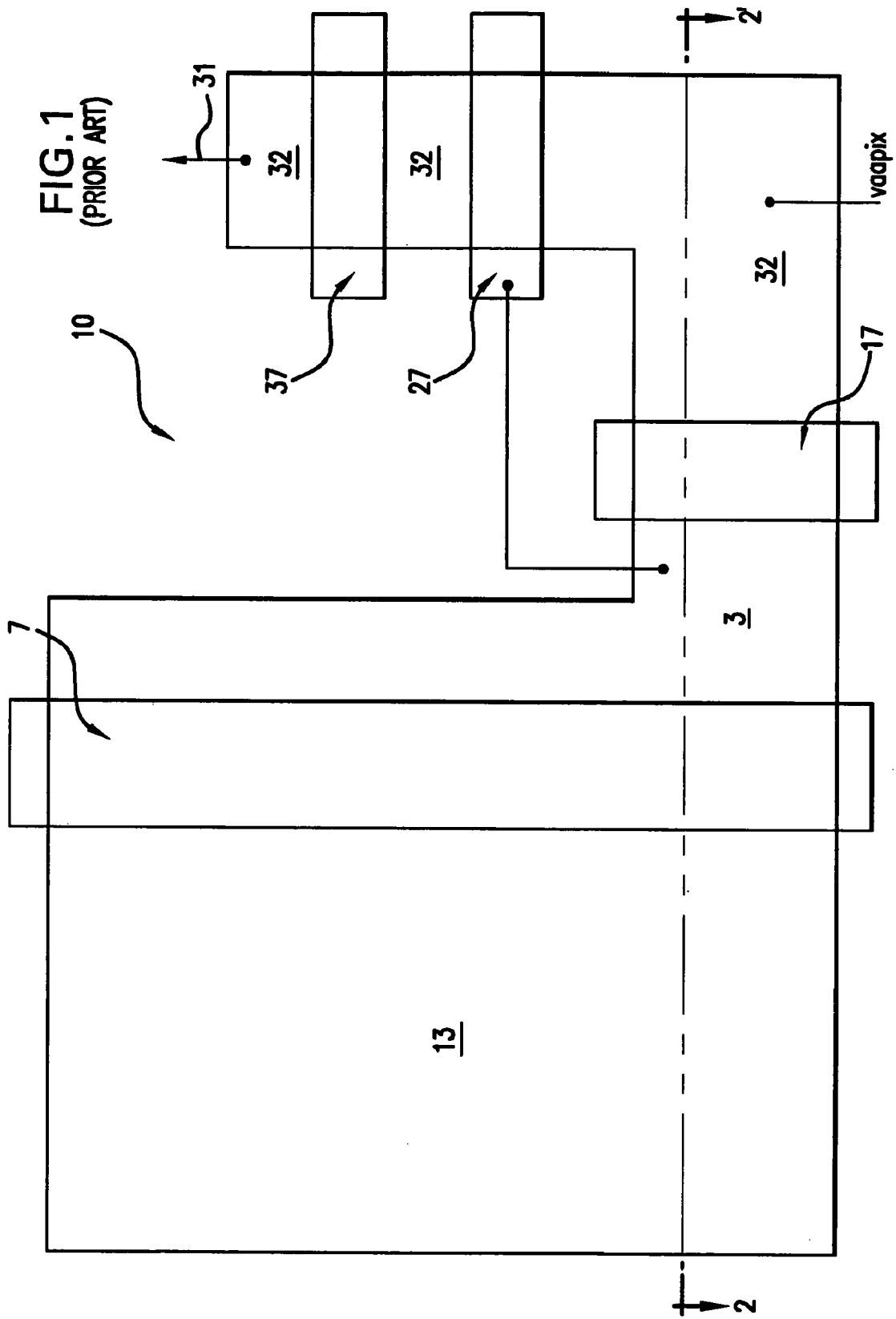
FIG. 1 is a top-down view of a conventional four transistor (4T) pixel cell.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The term "pixel" or "pixel cell" refers to a picture element unit cell containing a photosensor (i.e., a photodiode) and transistors for converting electromagnetic radiation to an electrical signal. For purposes of illustration, a portion of a representative pixel cell is illustrated in the figures and description herein. Where methods of operation are described, they are described with reference to a particular pixel cell for purposes of simplifying the explanation. It should be understood that the operation occurs for all of the pixel cells in an array. Steps of the operation may occur globally across the array, while other steps may occur sequentially, such as reading out signals from the pixel in a row-by-row manner.

The present invention, in various embodiments, relates to a pixel cell and its method of operation for efficiently transferring photo-charges during and at the end of a charge integration period. The efficient charge transfer has minimal dark current without experiencing fixed pattern noise or signal lag.

Figure 2:
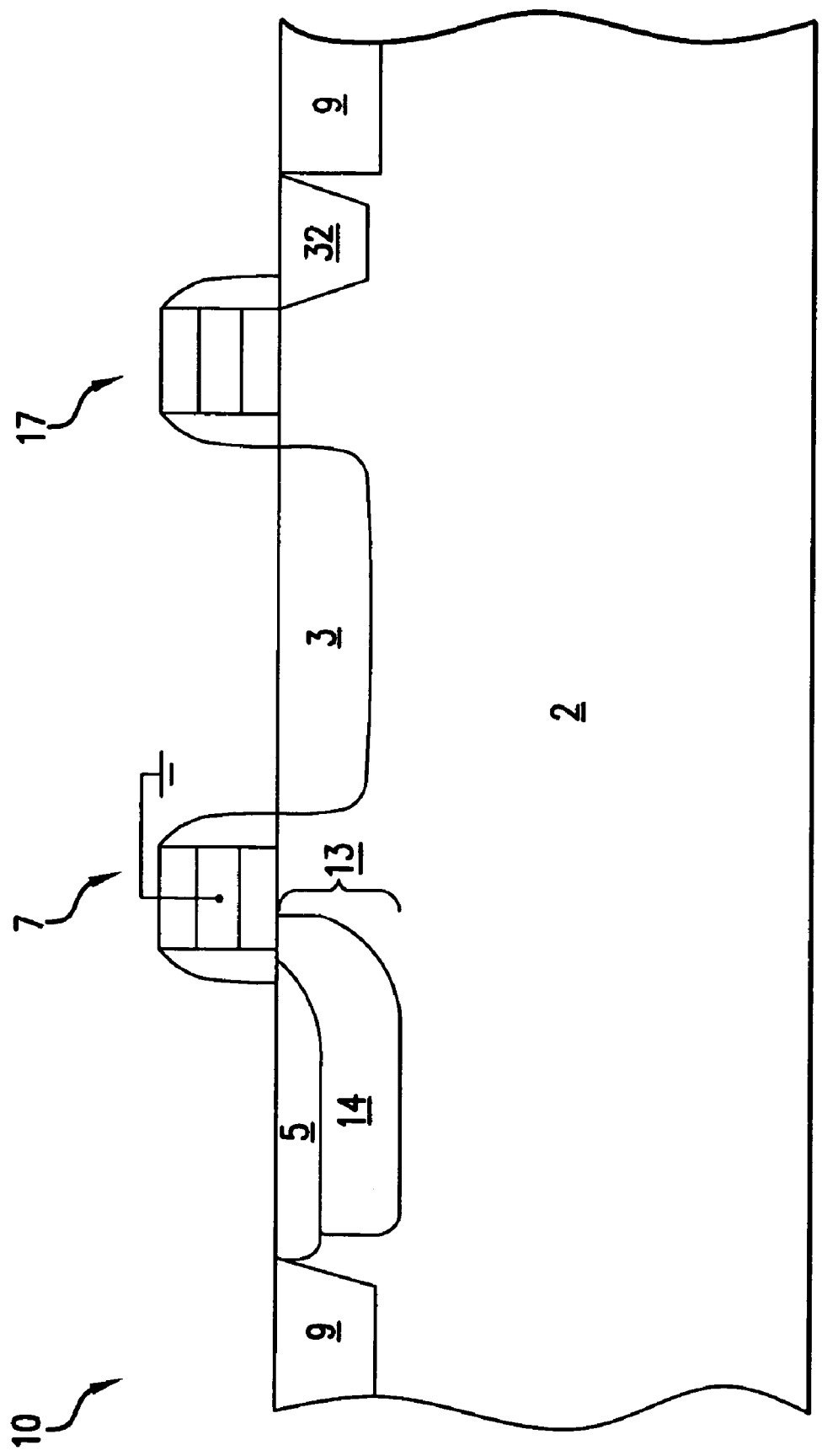
FIG. 2 is a cross-sectional view of the pixel cell of FIG. 1 taken along line 2-2'.
Figure 3:
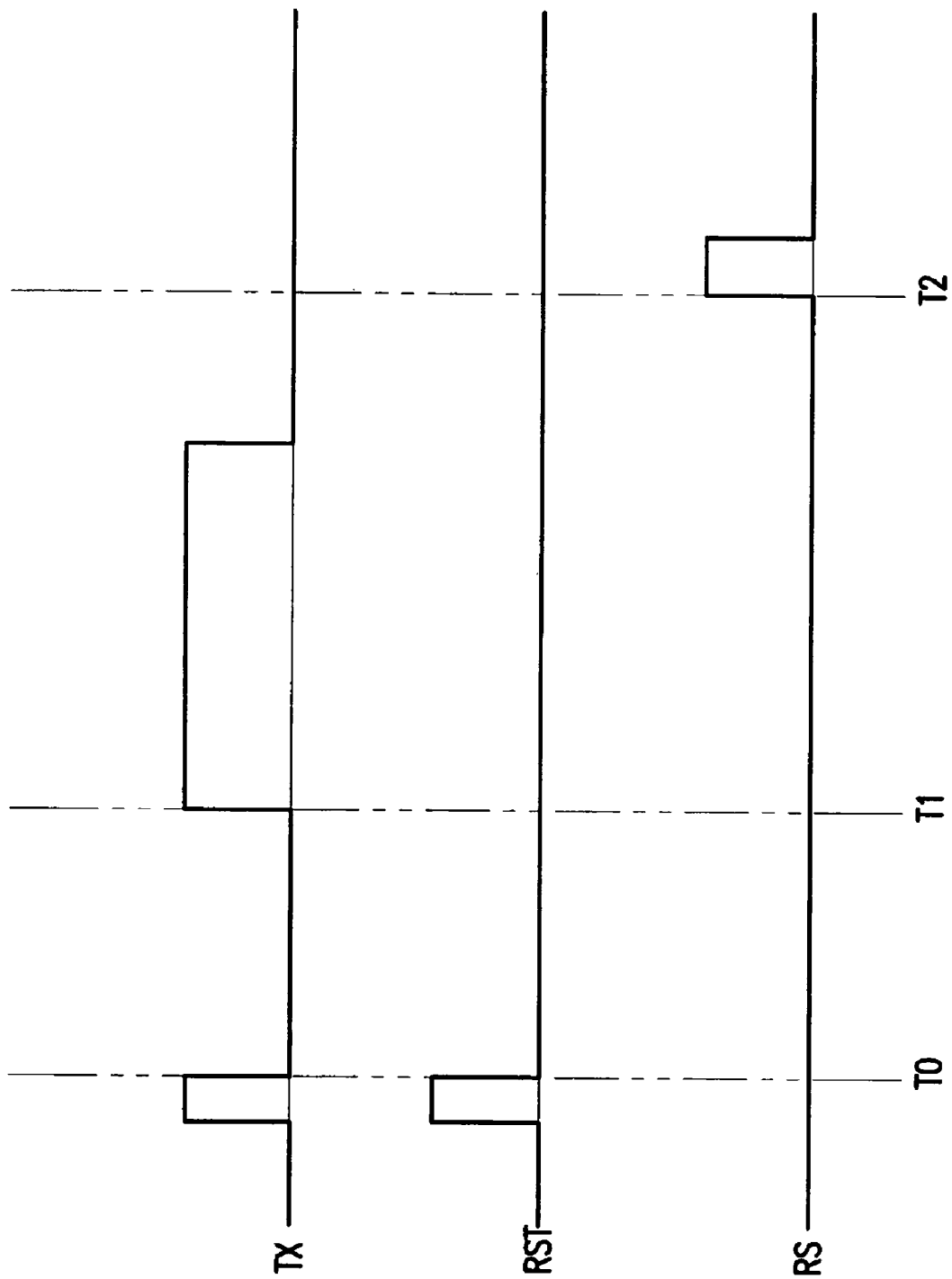
FIG. 3 is a timing diagram for the conventional pixel cell illustrated in FIGS. 1 and 2.
Figure 4:
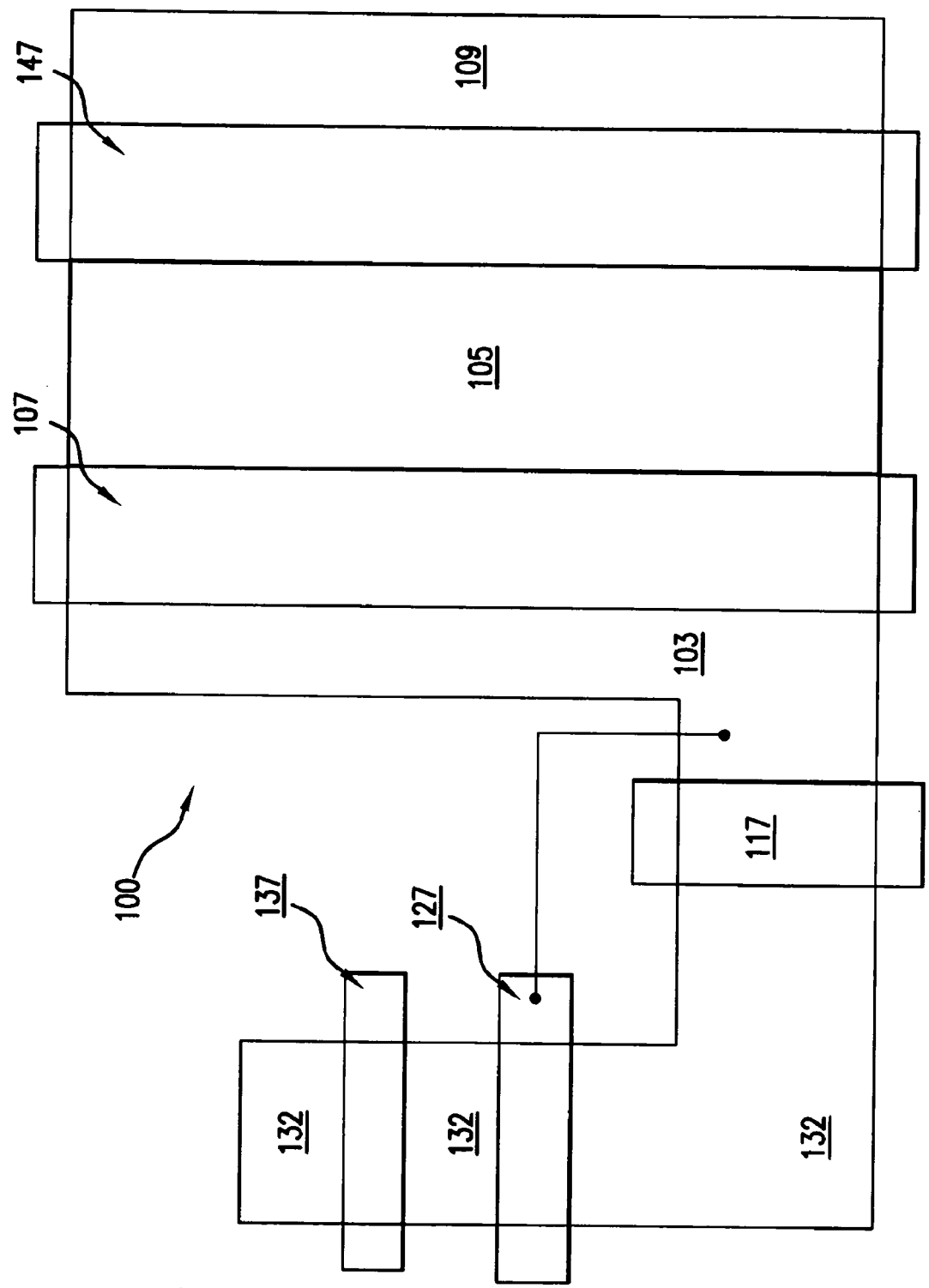
FIG. 4 is top-down view of an exemplary pixel cell constructed in accordance with the invention.

Now referring to the Figures, where like numerals represent like elements, FIG. 4 illustrates a pixel cell 100 constructed in accordance with an exemplary embodiment of the invention. Pixel cell 100 is a five-transistor (5T) pixel cell 100, which includes an anti-blooming gate 147, transfer gate 107, reset gate 117, source follower gate 127, and row select gate 137. The pixel cell 100 also has a photosensor 105 (e.g., a photodiode) for converting incoming light to photo-charges. A floating diffusion region 103 is on an opposite side of the transfer gate 107 as the photosensor 105. The floating diffusion region 103 is for receiving the photo-charges through the transfer gate 107, and for storing the charges until a read-out operation occurs from the pixel cell 100, which can be done as described above with reference to FIGS. 1-3.

The anti-blooming gate 147 can be operated to increase the dynamic range for the pixel cell 100 and to prevent unwanted blooming of photo-charges onto undesirable parts of the pixel cell 100 or to adjacent pixels. The anti-blooming gate 147 allows the overflow of excess photo-charges from the photodiode 105 to a drain region 109 which is coupled to a supply voltage. It should be understood, however, that although it is desirable for pixel cell 100 to have an anti-blooming transistor gate 147, that this gate 147 is not necessary. In fact, pixel cell 100 may have more or less than five transistors, depending on the desired imaging application in which the pixel cell 100 is utilized.

The pixel cell 100 can be operated in several exemplary modes in accordance with the invention. Three exemplary modes are illustrated by the timing diagrams shown in FIGS. 5-7 and as described below. It should be understood that the timing diagrams in FIGS. 5-7 have been simplified for purposes of explanation, removing signals unnecessary for the description of the efficient charge transfer of the invention. For example, it should be understood that other signals, such as signals to operate the row select 137 and anti-blooming 147 transistor gates, would also be used in connection with the operation of pixel cell 100. Except where noted otherwise, these transistors can be operated as known in the art, and known methods of reading out signals from pixel cell 100 can be used in connection with operation of the pixel cell.

Figure 5:
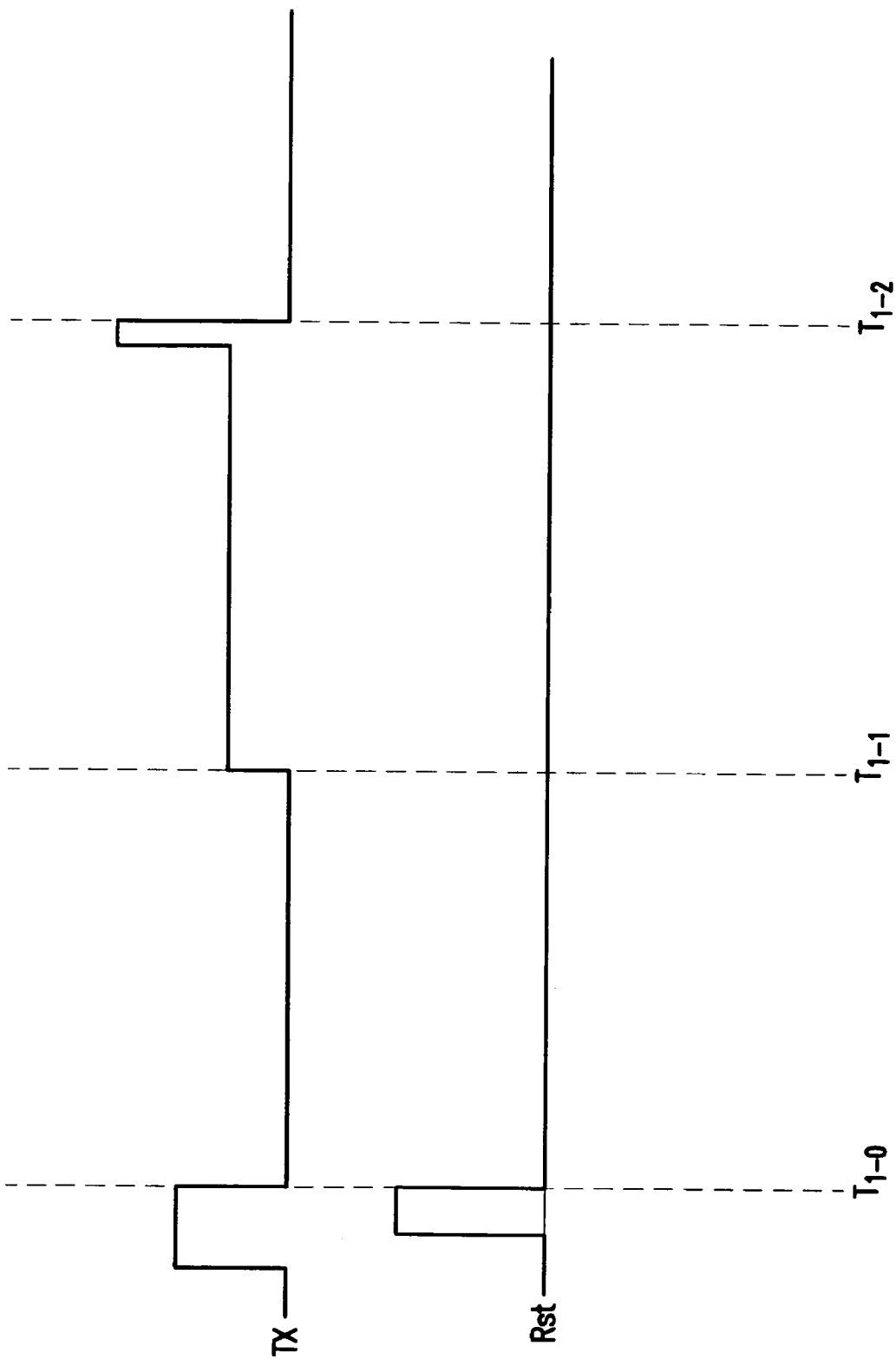
FIG. 5 is a timing diagram for a first exemplary method of operating a pixel cell in accordance with the invention.

The first exemplary transfer mode, as illustrated in FIG. 5, represents a linear mode of operation, meaning that the charges produced by the photosensor 105 during an integration period are linearly dependent upon time (up to a point of saturation of the photosensor 105). As shown in FIG. 5, an integration period for the pixel cell 100 begins at time $T_{1-0}$ by resetting the photosensor 105 and floating diffusion region 103, by turning both the transfer gate 107 and reset gate 117 at least partially "on," represented by raised transfer gate TX and reset RST signals. At this time, any charge at the photosensor 105 or floating diffusion region 103 is drained into drain region 132 and away from the pixel cell 100.

Thereafter, the transfer gate control signal TX is returned to low, and photo-charges are collected at the photosensor 105. At time $T_{1-1}$ the transfer gate 107 is turned on by at least partially raising the transfer gate control signal TX. In accordance with a preferred embodiment, the transfer gate control signal TX is only turned partially on. This partial activation represents an intermediate state for the transfer gate 107, where the voltage applied to the gate 107 is between zero and Vdd. As such, the dark current near the transfer gate 107 is less than it would be if a full transfer gate control signal TX was applied. During this period (between $T_{1-1}$ and $T_{1-2}$) charge is being collected in both the photosensor 105 and floating diffusion region 103 providing more charge capacity.

Just before the end of the integration period, at $T_{1-2}$, a higher transfer gate control signal TX is quickly pulsed. This pulse lowers the charge barrier between the photosensor 105 and the floating diffusion region 103 such that all photo-charges collected by the photosensor 105 will flow to the floating diffusion region 103. The high transfer gate control signal TX pulse, however, is done quickly so that dark current does not have time to build up in the substrate beneath the transfer gate 107. Thus, a complete charge transfer is done in accordance with this first exemplary mode of operation, without the drawbacks, such as dark current, associated with conventional charge transfer.

Figure 6:
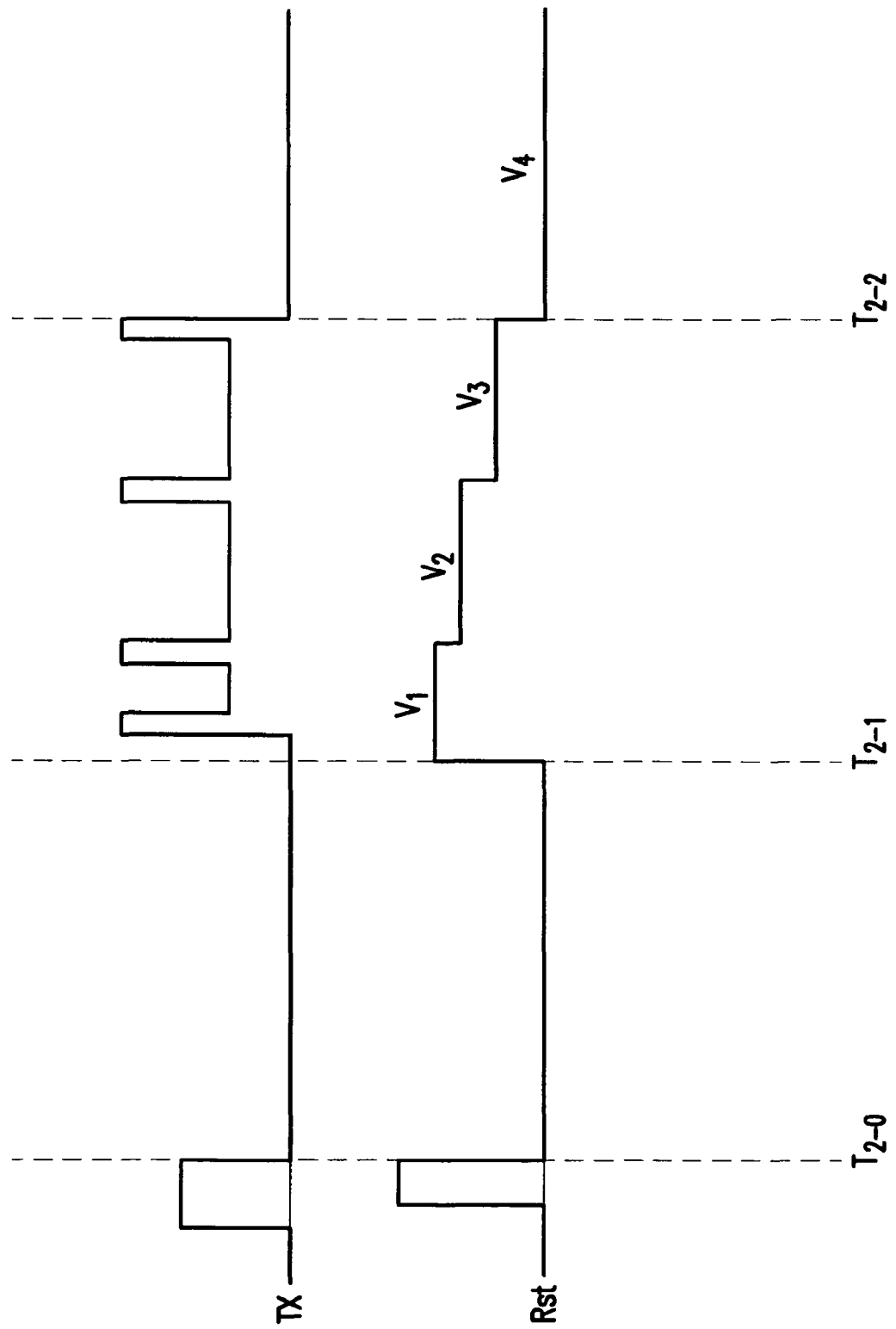
FIG. 6 is a timing diagram for a second exemplary method of operating a pixel cell in accordance with the invention.
Figure 7:
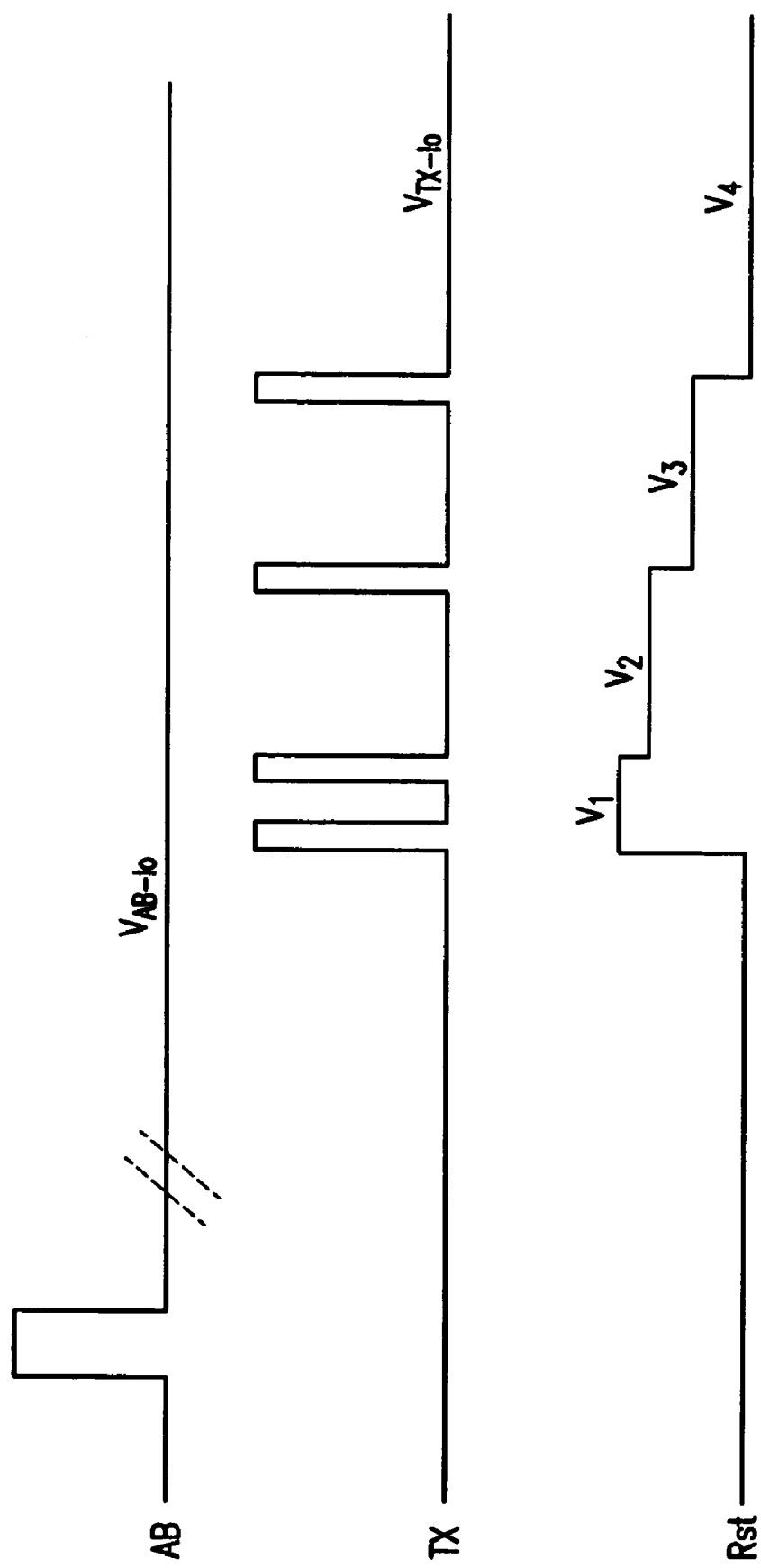
FIG. 7 is a timing diagram for a third exemplary method of operating a pixel cell in accordance with the invention.
Figure 8:
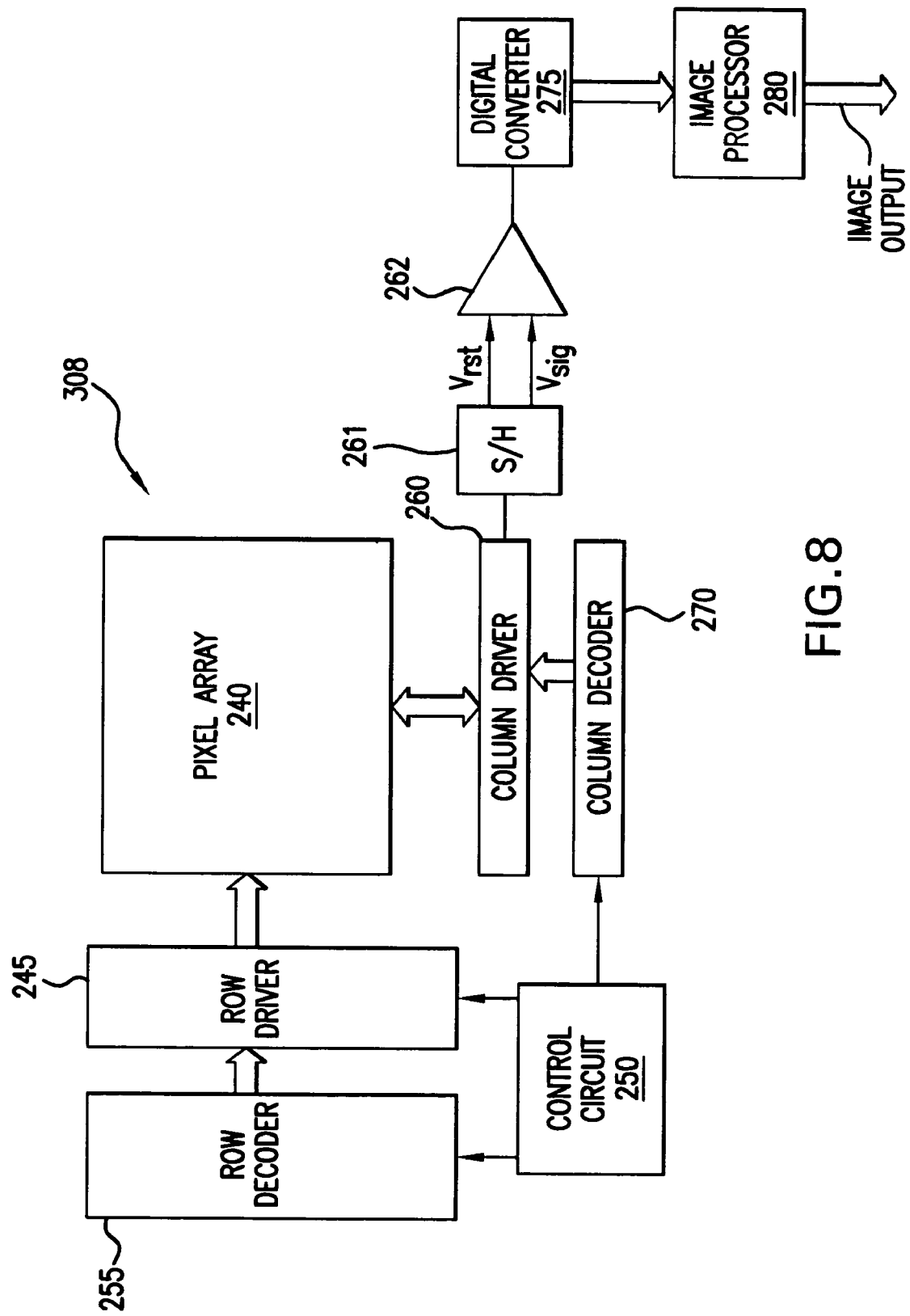
FIG. 8 is a block diagram of a CMOS image sensor according to an exemplary embodiment of the invention.

The second and third exemplary modes of operation are respectively illustrated by the timing diagrams shown in FIGS. 6 and 7. The second and third exemplary modes illustrate high dynamic range operation of the pixel cell 100. High dynamic range of a CMOS pixel is described in application Ser. No. 10/881,525, assigned to Micron Technology, Inc., and incorporated herein by reference. During high dynamic range operation, the pixel cell 100 can generate charges for a longer time before saturating, as the charge generation characteristic includes knee responses, based on controlled fluctuation of the reset voltage level. In accordance with this invention, when the pixel cell 100 is operated in high dynamic range mode, the reset gate voltage RST is changed from a high positive voltage to a lower positive voltage during the charge integration time. This can be controlled by a controller 250 (FIG. 8).

FIG. 6 illustrates a second exemplary method of operating pixel cell 100. An integration period begins at time $T_{2-0}$ when the photosensor 105 and floating diffusion region 103 are reset by turning on the transfer 107 and reset 117 gates, as described above. Each of these control signals then returns to low, and the photosensor 105 begins collecting photo-charges.

At time $T_{2-1}$, the transfer gate control signal TX is turned partially on and a first voltage $V_1$ is applied to the floating diffusion region 103 through the reset gate 117. At this time, some of the photo-charges accumulating in the photosensor 105 will begin to flow to the floating diffusion region 103. During the course of the integration period for pixel cell 100, the voltage applied to the reset gate 117 will be decreased. As shown in FIG. 6, the voltage level applied can be decreased to $V_2$ and thereafter to $V_3$. Other quantities and number of voltage level decreases are also within the scope of the invention.

In accordance with the invention, just before the voltage level on the reset gate 117 is first decreased, the transfer gate control signal TX is pulsed to the high level, by for example, pulling-up the applied voltage to the transfer gate 107. During the integration period, the transfer gate control signal TX pulses are done quickly, and the transfer gate signal TX returns to an intermediate state as shown, after each pulse.

A final transfer gate control signal TX pulse is done at the end of the integration period, at time $T_{2-2}$. At this point, all of the remaining photo-charges on the photosensor 105 should be transferred to the floating diffusion region 103. The transfer gate signal TX is then returned to the low level, as is the reset gate signal RST. It should be understood that the method would continue by reading out the photo-charges from the floating diffusion region 103 as a pixel signal $V_{sig}$ onto an appropriate column line. Thus, it should be understood that the repetition of corresponding transfer gate signal TX pulses can be done any pre-determined number of times, as determined to be appropriate for the desired results of the imaging application.

A third exemplary mode of operating pixel cell 100 is illustrated by the timing diagram shown in FIG. 7. This third exemplary mode is similar to the second exemplary mode, except where specifically noted. Rather than maintaining the transfer gate signal at an intermediate level between high pulses, as shown in FIG. 7, the transfer gate signal TX is maintained at a low state $V_{TX-lo}$, except for the pulses.

Also shown in FIG. 7 is a control signal AB for the anti-blooming transistor gate 147. It is important to note that in accordance with a preferred embodiment of the invention, $V_{AB-lo}$ is kept higher than the voltage level $V_{TX-lo}$ in order to avoid a spill-over of photo-charges over the transfer gate 107 during the integration period. In addition, the volume of photo-charges collected in the photosensor 105 should be larger than that stored in the floating diffusion region 103 so that the saturation level is limited by the reset gate signal RST, not be the anti-blooming gate signal AB. This operation can generate a minimum level of dark current under the transfer gate 107, while guaranteeing complete charge transfer. This operation is then able to create a very high image quality with low noise and high dynamic range.

Figure 7A:
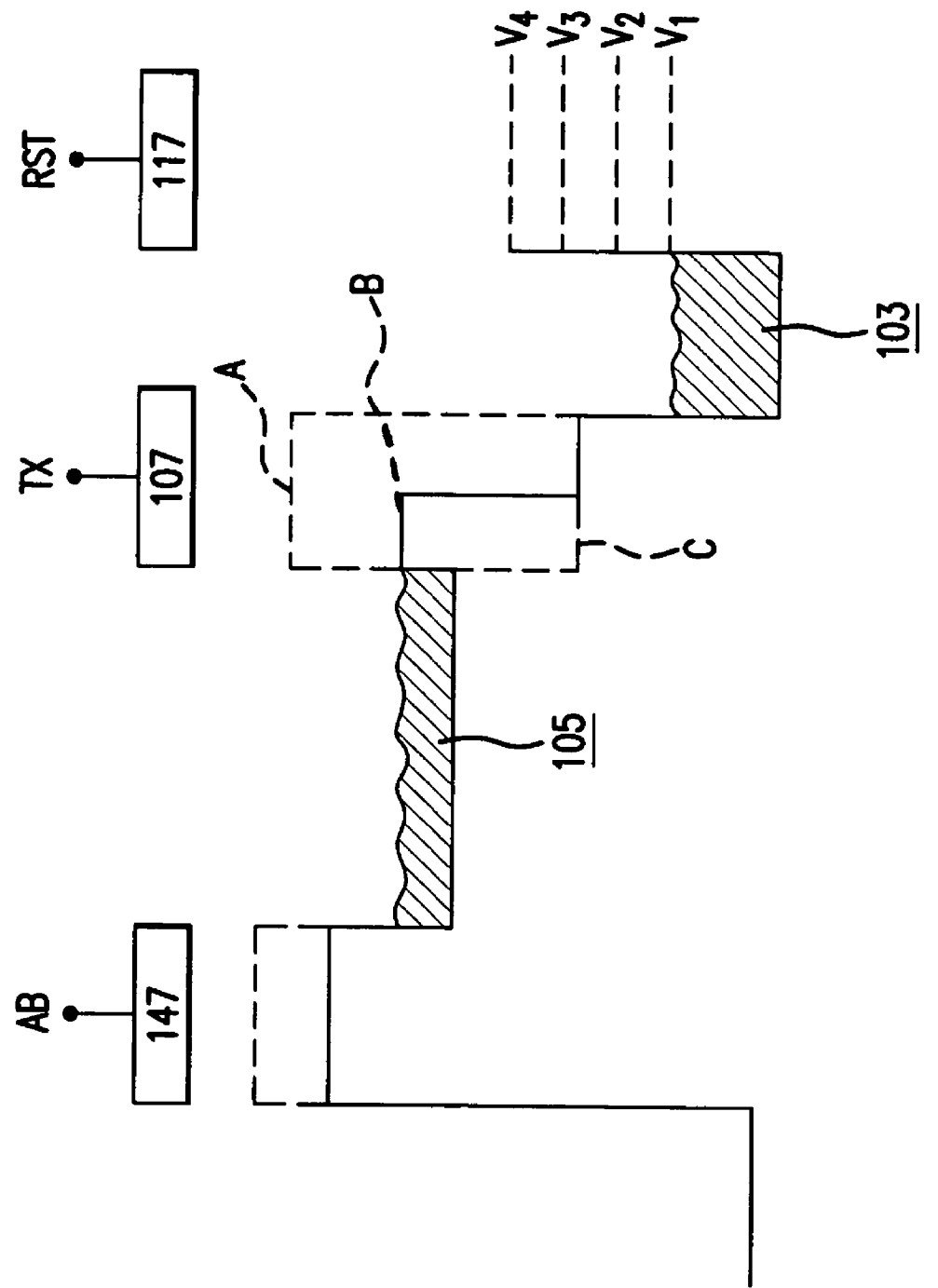
FIG. 7a is a potential diagram for a pixel cell operated in accordance with one of the exemplary methods in accordance with the invention.

Turning to FIG. 7A, a potential diagram for pixel cell 100 illustrates various potential barriers during operation of the pixel cell 100 in accordance with the invention. The hatched areas represent a volume of accumulating charges, which are shown in the photosensor 105 area and the floating diffusion region 103. Now, depending on the voltage level applied to each of the anti-blooming 147, transfer 107 and reset 117 gates, the electrons will face fluctuating charge barriers, and only once enough charges have accumulated will the charges flow over the barrier onto the next region.

In accordance with the invention, the transfer gate 107 can receive a ground potential (negative voltage), an intermediate voltage, or a high voltage (greater than or equal to a power supply voltage Vdd). At point A, the transfer gate 107 receives a ground potential (negative voltage), and electrons are strongly prohibited by a large potential barrier from flowing to the floating diffusion region 103. When the transfer gate 107 receives an intermediate voltage, at point B, the gate 107 is partially turned "on" and the barrier between the photosensor 105 and the floating diffusion region 103 is lowered. Finally, at point C, the transfer gate is pulsed "on" with a high voltage level. At this point, there is almost no potential barrier, and electrons freely flow to the floating diffusion region 103. Thus, operating the transfer gate 107 at point C and one or more of points A or B during an integration period in accordance with the embodiments described above, results in a complete charge transfer without experiencing the unwanted effects of dark current.

The exemplary pixel cell and operation methods of the present invention can be used in a pixel array 240 of an imager device 308 as shown in FIG. 8. The pixel array 240 comprises a plurality of pixel cells arranged in a predetermined number of columns and rows, with each pixel cell being constructed and operated in accordance with one of the exemplary embodiments described above. Connected to the array 240 is signal processing circuitry, at least part of which may be formed in the substrate. The pixel cells of each row in array 240 are all turned on at the same time by a row select line, and the pixel cells of each row are selectively output by respective column select lines. A plurality of row and column lines are provided for the entire array 240. The row lines are selectively activated by a row driver 245 in response to row address decoder 255. The column select lines are selectively activated by a column driver 260 in response to column address decoder 270. Thus, a row and column address is provided for each pixel.

The CMOS imager 308 is operated by a timing and control circuit 250, which controls address decoders 255, 270 for selecting the appropriate row and column lines for pixel readout and for applying the transfer and reset transistor control voltages described above. The control circuit 250 also controls the row and column driver circuitry 245, 260 such that they apply driving voltages to the drive transistors of the selected row and column lines. The pixel cell column signals, which typically include a pixel reset signal ($V_{rst}$) and a pixel image signal ($V_{sig}$), are read by a sample and hold circuit 261. A differential signal ($V_{rst}$-$V_{sig}$) is produced for each pixel by differential amplifier 262. The differential signal is digitized by analog-to-digital converter 275 (ADC). The analog-to-digital converter 275 supplies digitized pixel signals to an image processor 280, which forms and outputs a digital image.

FIG. 9 illustrates a processor-based system 1100 including an imaging device 308, which has pixels constructed in accordance with the embodiments described herein. For example, the pixels may be constructed and operated in accordance with the exemplary embodiments of the invention. The processor-based system 1100 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other digital imaging systems.

The processor-based system 1100, for example a camera system, generally comprises a central processing unit (CPU) 1102, such as a microprocessor, that communicates with an input/output (I/O) device 1106 over a bus 1104. Imaging device 308 also communicates with the CPU 1102 over the bus 1104. The processor-based system 1100 also includes random access memory (RAM) 1110, and can include removable memory 1115, such as flash memory, which also communicates with CPU 1102 over the bus 1104. Imaging device 308 may be combined with a processor, such as a CPU, digital signal processor, or microprocessor, with or without memory storage on a single integrated circuit or on a different chip than the processor. Any of the memory storage devices in the processor-based system 1100 could store software for employing the above-described methods.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of operating a pixel cell comprising:
   initiating an integration period for the pixel cell during which a photosensor collects photo-charges;
   turning on a transfer gate by applying a first signal level to the transfer gate of the pixel cell during the integration period such that a first amount of photo-charges are transferred from the photosensor to a storage region;
   applying a second signal level to the transfer gate during the integration period such that a second amount of photo-charges are transferred from the photosensor to the storage region, said second signal level being a pulsed signal, wherein the first signal lasts longer than the second signal; and
   applying a first reset signal level to a reset gate of the pixel cell during the integration period,
   wherein the act of applying a pulsed second signal level to the transfer gate occurs just before the act of decreasing the reset signal level.

2. The method of claim 1, wherein said first signal level represents an intermediate level, between zero and a full turn on voltage for the gate of the transfer transistor.

3. The method of claim 2, wherein said first signal level is at a power supply voltage for the pixel cell.

4. The method of claim 1, further comprising the act of decreasing the reset level from the first reset level to a second reset level during the integration period.

5. The method of claim 1, further comprising the acts of:
   decreasing the voltage applied to the reset gate from the first reset signal level to a second reset signal level during the integration period; and
   decreasing the voltage of the second reset signal level to a third signal level during the integration period.

6. A method of operating a pixel cell comprising:
   initiating an integration period for the pixel cell during which a photosensor collects photo-charges;
   turning on a transfer gate by applying a first signal level to the transfer gate of the pixel cell during the integration period such that a first amount of photo-charges are transferred from the photosensor to a storage region;
   applying a second signal level to the transfer gate during the integration period such that a second amount of photo-charges are transferred from the photosensor to the storage region, said second signal level being a pulsed signal, wherein the first signal lasts longer than the second signal;
   applying a first reset signal level to a reset gate of the pixel cell during the integration period;
   decreasing the voltage applied to the reset gate from the first reset signal level to a second reset signal level during the integration period; and
   decreasing the voltage of the second reset signal level to a third signal level during the integration period,
   wherein the transfer gate signal applied to the transfer gate is pulsed before each act of decreasing the reset signal level.

7. A method of operating a pixel cell comprising:
   initiating an integration period for the pixel cell during which a photosensor collects photo-charges;
   turning on a transfer gate by applying a first signal level to the transfer gate of the pixel cell during the integration period such that a first amount of photo-charges are transferred from the photosensor to a storage region;

applying a second signal level to the transfer gate during the integration period such that a second amount of photo-charges are transferred from the photosensor to the storage region, said second signal level being a pulsed signal, wherein the first signal lasts longer than the second signal;

applying a first reset signal level to a reset gate of the pixel cell during the integration period;

decreasing the voltage applied to the reset gate from the first reset signal level to a second reset signal level during the integration period; and decreasing the voltage of the second reset signal level to a third signal level during the integration period, wherein the transfer gate signal applied to the transfer gate is pulsed before each act of decreasing the reset signal level, and wherein both of the transfer gate signals and the reset gate signals are returned to ground at an end of the integration period.

* * * * *